(12) United States Patent
Pettersson et al.

(10) Patent No.: US 11,379,626 B2
(45) Date of Patent: Jul. 5, 2022

(54) CONSTRUCTION MANAGEMENT SYSTEM

(71) Applicant: HEXAGON TECHNOLOGY CENTER GMBH, Heerbrugg (CH)

(72) Inventors: Bo Pettersson, Luxembourg (LU); Håkan Andersson, Karlskoga (SE); Jonas Wedin, Karlskoga (SE)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 528 days.

(21) Appl. No.: 15/679,050

(22) Filed: Aug. 16, 2017

(65) Prior Publication Data

US 2018/0052949 A1 Feb. 22, 2018

(30) Foreign Application Priority Data

Aug. 16, 2016 (EP) .................................. 16184399

(51) Int. Cl.
  *G06F 30/13* (2020.01)
  *G06Q 50/08* (2012.01)
  (Continued)

(52) U.S. Cl.
  CPC .......... *G06F 30/13* (2020.01); *G06F 3/04815* (2013.01); *G06Q 10/06313* (2013.01);
  (Continued)

(58) Field of Classification Search
  CPC .. G06F 17/5004; G06F 3/04815; G06F 16/00; G06F 30/13; G06Q 50/08; G06Q 10/06313; G06Q 10/10
  See application file for complete search history.

(56) References Cited

U.S. PATENT DOCUMENTS

2006/0267754 A1* 11/2006 Takeda ............... G05B 23/0264
  340/506
2012/0066019 A1* 3/2012 Hinshaw ................ G06Q 10/06
  705/7.23
(Continued)

FOREIGN PATENT DOCUMENTS

CN 103616011 A 3/2014
CN 103886139 A 6/2014
(Continued)

OTHER PUBLICATIONS

Extended European Search Report dated Sep. 30, 2016 as received in Application No. 16184399.0.

*Primary Examiner* — Steven W Crabb
(74) *Attorney, Agent, or Firm* — Maschoff Brennan

(57) ABSTRACT

A method for producing parts for a local structure at a construction site using a building information model, the building information model being stored on a central computing unit and providing data about the construction site or a building to be constructed at the construction site. The method includes determining dimensions of parts needed for the construction of the local structure; and producing the needed parts according to the determined dimensions, wherein determining the dimensions comprises a measuring operation performed by a user, wherein the user is guided through the measuring operation by a portable computing device using data provided by the building information model. The dimensions are provided to a work shop which is situated at the construction site and the needed parts are produced at the work shop according to the provided dimensions.

26 Claims, 4 Drawing Sheets

(51) Int. Cl.
*G06F 3/04815* (2022.01)
*G06Q 10/06* (2012.01)
*G06F 16/00* (2019.01)
*G06Q 10/10* (2012.01)

(52) U.S. Cl.
CPC ............ *G06Q 50/08* (2013.01); *G06F 16/00* (2019.01); *G06Q 10/10* (2013.01)

(56) References Cited

U.S. PATENT DOCUMENTS

| | | | |
|---|---|---|---|
| 2013/0096873 A1* | 4/2013 | Rosengaus | G01C 15/002 |
| | | | 702/151 |
| 2013/0169681 A1 | 7/2013 | Rasane et al. | |
| 2014/0192159 A1 | 7/2014 | Chen et al. | |
| 2014/0268064 A1 | 9/2014 | Kahle et al. | |
| 2015/0242542 A1* | 8/2015 | Bosdriesz | G01C 11/00 |
| | | | 703/1 |
| 2016/0224927 A1 | 8/2016 | Pettersson | |
| 2017/0184721 A1* | 6/2017 | Sun | G01S 17/10 |

FOREIGN PATENT DOCUMENTS

| | | |
|---|---|---|
| CN | 105089216 A | 11/2015 |
| CN | 105335559 A | 2/2016 |
| CN | 105677978 A | 6/2016 |
| CN | 105701282 A | 6/2016 |
| CN | 105843834 A | 8/2016 |
| EP | 2 629 210 A1 | 8/2013 |
| JP | 5489310 B1 | 5/2014 |
| KR | 10-2004-0017642 A | 2/2004 |

\* cited by examiner

CONSTRUCTION MANAGEMENT SYSTEM

FIELD OF THE INVENTION

The present invention pertains to a method for producing parts for a local structure to be built at a building site using a building information model (BIM), and to a construction management system for the building site using the BIM.

BACKGROUND

In the art of general construction work such as building construction and civil engineering, planning, progress observation, documentation, appropriate accounting are important key factors. In many instances, those aspects are getting more and more complex and dynamic, in particular due to the many parties involved, fluctuating human and/or objective resources, increased complexity of the end results, tighter schedules, increased costs of human resources, etc. Work that was formerly planed and overseen by a single manager is nowadays too complex for a single person and a splitting between multiple people often miscarries at the thereby uprising interfaces.

Therefore, it has been tried to expand automation and computerization in this technical field. For example, in the art of building construction EP 2 629 210, JP 5489310, CN 103886139, US 2014/268064 or US 2014/192159 are giving examples of so-called BIM-System approaches.

The technical problems therewith are multifarious. For example: Paper based orders might be outdated by the time they are issued to the executing entity. An immediate response to and purposeful handling of the unexpected is required, wherein all the consequences to a desired schedule have to be considered to minimize impact. Detecting, handling and documenting of the done work has to be established, deviations from a planed schedule have to be documented, determined and handled. Therein, the existing dependencies are often too complex to immediately cope with, in particular for an on-site executing entity.

In certain BIM software packages, where the construction of a house is controllable, the construction is split into a number of work-packages.

The role of a carpenter at a construction site can be used as an example for a work-package: At present, the carpenter brings material to the site where an inner wall is to be constructed, said material normally comprising whole plaster-boards, studs per meter, etc. At best, there are marks on the floor where the studs should be located, otherwise the carpenter (or another person) needs to measure the position where things should be located. When this is done, the carpenter has to cut the studs to proper length and cut the plasterboards so they will fit. Normally, there is at least 10-15% wasted material just to make sure that the carpenter can do his job. To make this happen to the right quality and usage of material there is high demands on the skills of the craftsman. However when the work package is finished there will always be extra material that normally goes into the scrap bin.

SUMMARY

The same or similar problems arise with work packages of other roles.

Some embodiments of the invention are directed to a part of a work package is shifted to a central work shop. One proper way of manage this is to introduce the following work-flow: In the above-mentioned example work package "assembly of an inner wall" one can assume that the work package is preceded by other work packages that provide the geometries where the inner wall should be built. Normally, the work-package comprises a positioning step, a building step, and a self-check step. The geometries of where the wall should be positioned are either provided by the self-check part of the preceding work packages, or the work package will start with performing those measurements. With these geometries in combination with a prescription of how to construct an inner wall, the needed number of studs of different length, the needed number of plasterboards and their dimensions can be calculated. The result of this measurement is then sent to a central work shop where all parts will be produced and optionally numbered. They can then be put on a pallet and sent to the location where they should be assembled.

Advantages of this solution comprise the following:
Waste of material will be reduced,
The quality of the produced parts is increased,
Production of parts is more efficient,
The craftsmen need fewer skills,
The risk of errors is reduced,
The speed of assembly is enhanced.

Some embodiments of the present invention to provide an improved construction management system for a building site of a structure.

Some embodiments provide such a system which allows a reduction of waste of material.

Some embodiments to provide such a system which facilitates the measurement for a user.

Some embodiments are directed to a method for producing parts for a local structure according to claim 1, the construction management system according to claim 9 and/or the dependent claims of the present invention.

Some embodiments of the present invention relate to a method for producing parts for a local structure at a construction site using a building information model, the building information model being stored on a central computing unit and providing data about the construction site and/or a building to be constructed at the construction site. Said method comprises determining dimensions of parts needed for the construction of the local structure, and producing the needed parts according to the determined dimensions. According to the invention, determining the dimensions comprises a measuring operation performed by a user, wherein the user is guided through the measuring operation by a portable computing device using data provided by the building information model, the dimensions are provided to a work shop which is situated at the construction site, and the needed parts are produced at the work shop according to the provided dimensions. The work shop of course need not be situated directly on the construction site itself, but can be situated in the immediate vicinity.

In one embodiment of the method according to the invention, for producing parts for a plurality of local structures at the same construction site, determining the dimensions comprises at least performing a first measuring operation at a first location of the construction site and performing a second measuring operation at a second location of the construction site. According to this embodiment, the at least first and second measuring operations each are performed by a user, wherein the respective user is guided through the measuring operation by a portable computing device using data provided by the building information model, and producing the needed parts takes into account the dimensions determined through the at least first and second measuring operations.

In another embodiment of the method, the portable computing device comprises measuring functionality for determining the dimensions, particularly an electronic distance meter, and performing the measuring operation comprises using the measuring functionality of the portable computing device.

In yet another embodiment, providing the dimensions to the work shop comprises the portable computing device transmitting the dimensions, particularly automatically and particularly during or directly after the measuring operation.

According to one embodiment, the determined dimensions are transmitted to the central computing unit. The dimensions are then entered into a database of the building information model, and/or provided to the work shop from the central computing unit.

According to a further embodiment, the needed parts are produced by at least one machine of the work shop that is connected to the central computing unit by means of an internet or intranet connection.

In one embodiment, the needed parts are produced automatically by the at least one machine.

According to another embodiment, the method according to the invention comprises transporting the produced parts to the location of the measuring operation, and building the local structure using the produced parts, particularly wherein the local structure is a drywall and the produced parts comprise plaster boards and studs.

In a further embodiment, the work shop is a mobile work shop comprising a fixed set of machines and being adapted for producing similar parts for similar local structures at a multitude of different constructions sites, the method comprising providing the mobile work shop at the construction site.

Some embodiments of the present invention relate to a construction management system for the construction of a building at a construction site. The system comprises a central computing unit providing a building information model comprising at least a three-dimensional model of the construction site or of the building, a construction plan comprising a target state of the construction of the building, or information about a current construction state of the building. The system also comprises a portable computing device being connectable to the central computing unit by means of a wireless data connection and being adapted to provide data comprised by the building information model to a user.

According to the invention, the system is adapted to control a production of parts for a local structure at the construction site, the portable computing device being adapted to guide the user through a measuring operation at the construction site by using data provided by the building information model, and to transmit dimensions that are determined in the course of the measuring operation to the central computing unit. The system further comprises a work shop which is situated at the construction site, the work shop comprising at least one machine that is adapted to produce parts according to the dimensions that are determined during the measuring operation.

In one embodiment of the construction management system according to the invention, the central computing unit comprises at least one server computer, particularly a cluster of server computers working as a cloud system, wherein the portable computing device is adapted to transmit the dimensions to the central computing unit by means of an internet or intranet connection.

In another embodiment of the construction management system according to the invention, the portable computing device comprises measuring functionality for determining the dimensions, particularly an electronic distance meter.

In another embodiment, the portable computing device is adapted to transmit the determined dimensions to the central computing unit automatically, in particular during or directly after the measuring operation.

In yet another embodiment, for providing instructions for measuring steps of the measuring operation to the user, the portable computing device comprises a display for providing graphical and/or text instructions to the user and/or a loudspeaker for providing voice instructions to the user.

In a further embodiment of the system, the at least one machine of the work shop is adapted to produce the parts according to the dimensions autonomously.

According to another embodiment, the work shop is a mobile work shop comprising a fixed set of machines and being adapted for use at a multitude of different constructions sites, particularly for producing parts of at least one parts category for local structures at each of the different constructions sites.

In particular, said mobile work shop comprises at least one container in which the machines are provided, particularly fixedly positioned; and/or is provided as a part of a vehicle or trailer or transportable by a vehicle or trailer.

Some embodiments of the present invention relate to a computer programme product comprising programme code which is stored on a machine-readable medium, or being embodied by an electromagnetic wave comprising a programme code segment, and having computer-executable instructions for performing, in particular when run on calculation means of a construction management system according to the second aspect of the invention, at least the following steps of the method according to the first aspect of the invention:

guiding a user through a measuring operation using data provided by a building information model;

determining dimensions of parts in the measuring operation; and producing the needed parts according to the determined dimensions at a work shop.

BRIEF DESCRIPTION OF THE DRAWINGS

The invention in the following will be described in detail by referring to exemplary embodiments that are accompanied by figures, in which:

FIG. 4 illustrates the use of an exemplary embodiment of a construction management system according to the invention for performing the embodiment of the method of FIG. 3a.

DETAILED DESCRIPTION

Figure 1:
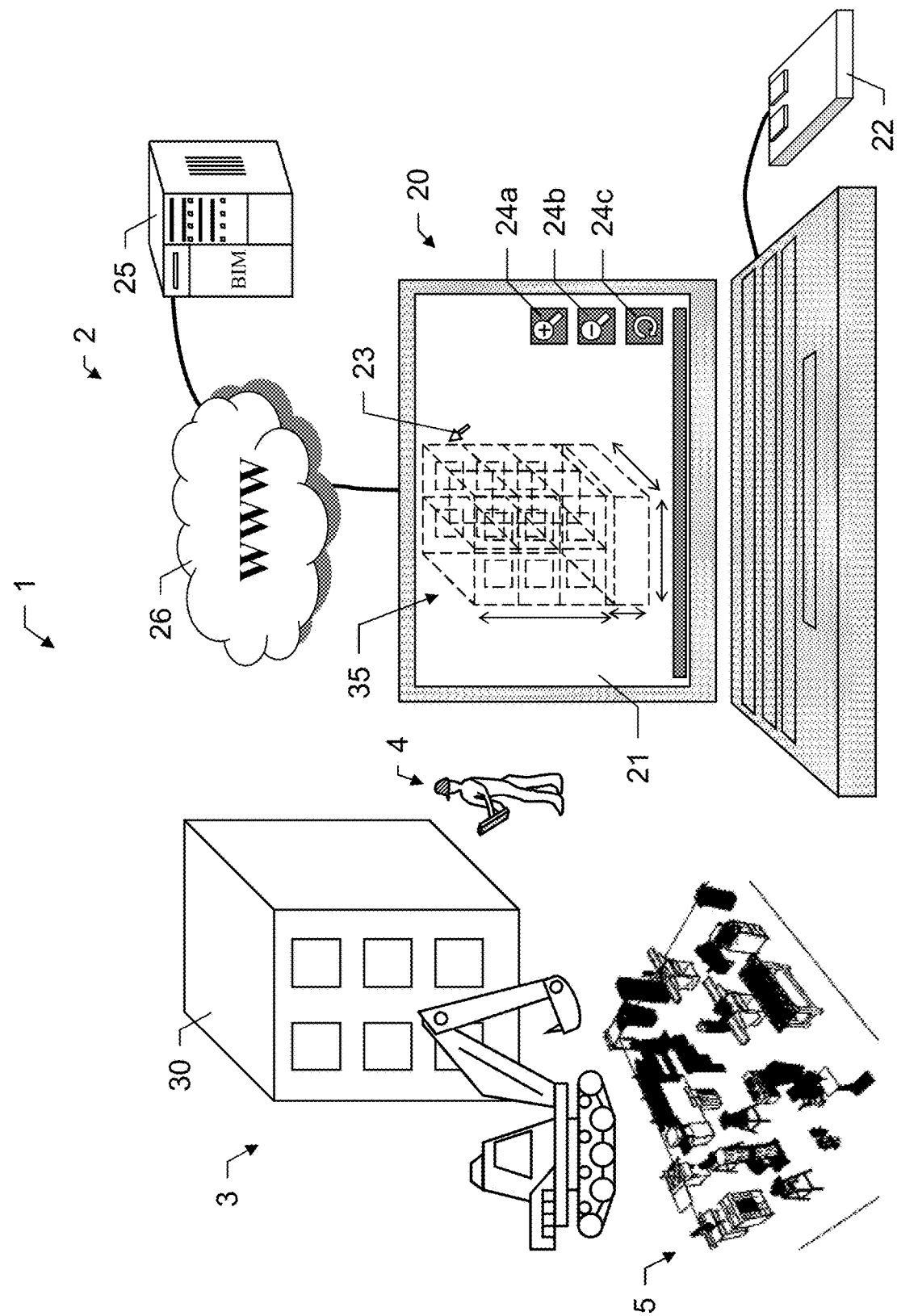
FIG. 1 shows the components of an exemplary embodiment of a construction management system according to the invention.

In FIG. 1 an exemplary embodiment of a construction management system 1 according to the invention is depicted.

The system comprises a computer system 2 comprising one or more display units 20 and a server computer 25 that are connected by means of an internet connection 26. In the shown example, the display unit 20 is a laptop comprising a display 21 (output means) and a mouse 22 (input means). On the display 21 a graphical user interface (GUI) is displayed with a mouse cursor 23 and several buttons 24*a-c*. In the GUI, a three-dimensional model 35 of a building 30 is visualized. A user (not shown) of the laptop is enabled to change the view on the model 35 by moving the cursor 23 on one of the GUI buttons 24*a-c* and clicking on a button of the mouse 22 (e. g. rotate the model, zoom in or out).

The system furthermore comprises a work shop 5 that is located at a building site 3 of the building 30 that is represented by the three-dimensional model 35.

Instead of a building, the construction can of course also be or comprise infrastructure such as roads or railways. Further, instead of a single server computer 25, a cluster of servers, a cloud or similar means can be used.

Figure 2:
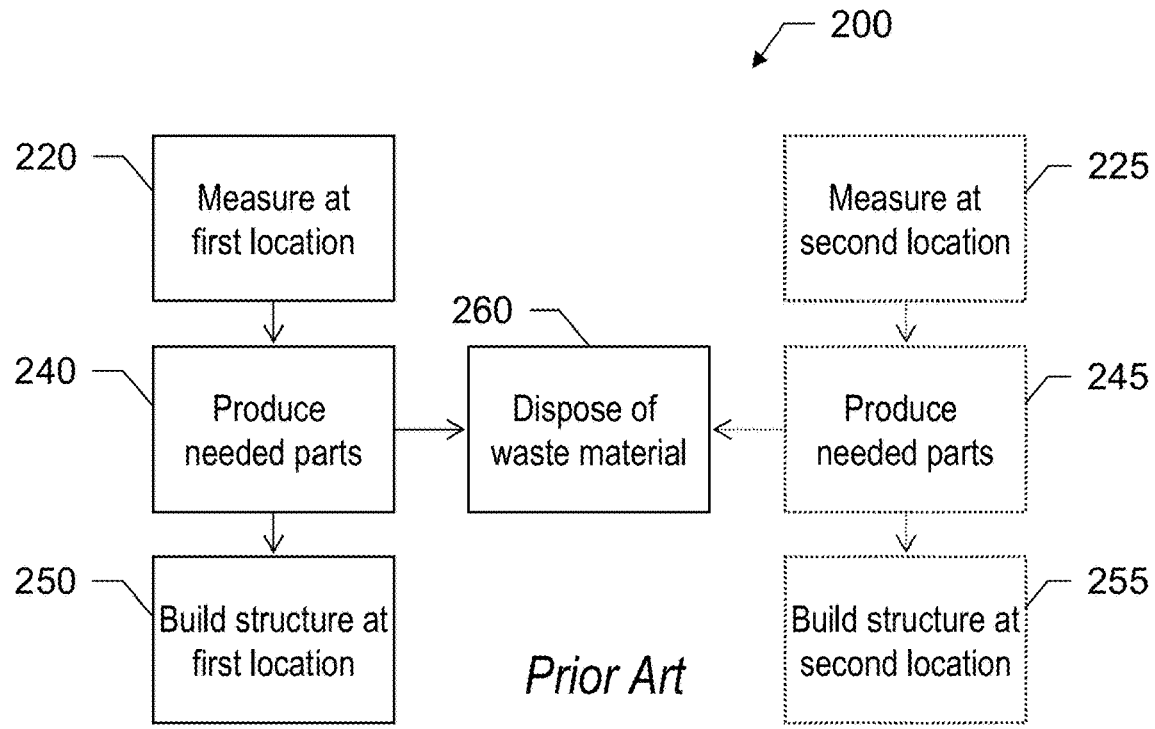
FIG. 2 shows a flow-chart illustrating a prior art method for manufacturing needed parts at a construction site.

FIG. 2 is a flow chart illustrating a prior art method 200 for manufacturing needed parts at a construction site. A craftsman performs a measurement 220 at a first location of the construction site where a local structure is to be built, in order to determine dimensions. For instance, this could be a carpenter who has to build an inner drywall from plasterboards to separate two rooms of the building. After the measurement, the craftsman produces the needed material 240 according to the determined dimensions. In particular, the craftsman processes raw material in order to bring it into the needed dimensions. In the example of the carpenter building a drywall, the carpenter cuts studs to the needed length and plasterboards to needed length and width. Then, having produced the needed parts, the local structure is built 250 at the first location. Waste material needs to be disposed of.

These steps can optionally be repeated by the same or other craftsmen in the same building at a second or more locations: measuring the dimensions for the parts at these locations (step 225), produce the needed parts (step 245) and build the local structure at the respective location (step 255). With every repetition, new waste material is produced that needs to be disposed of (step 260).

Figure 3A:
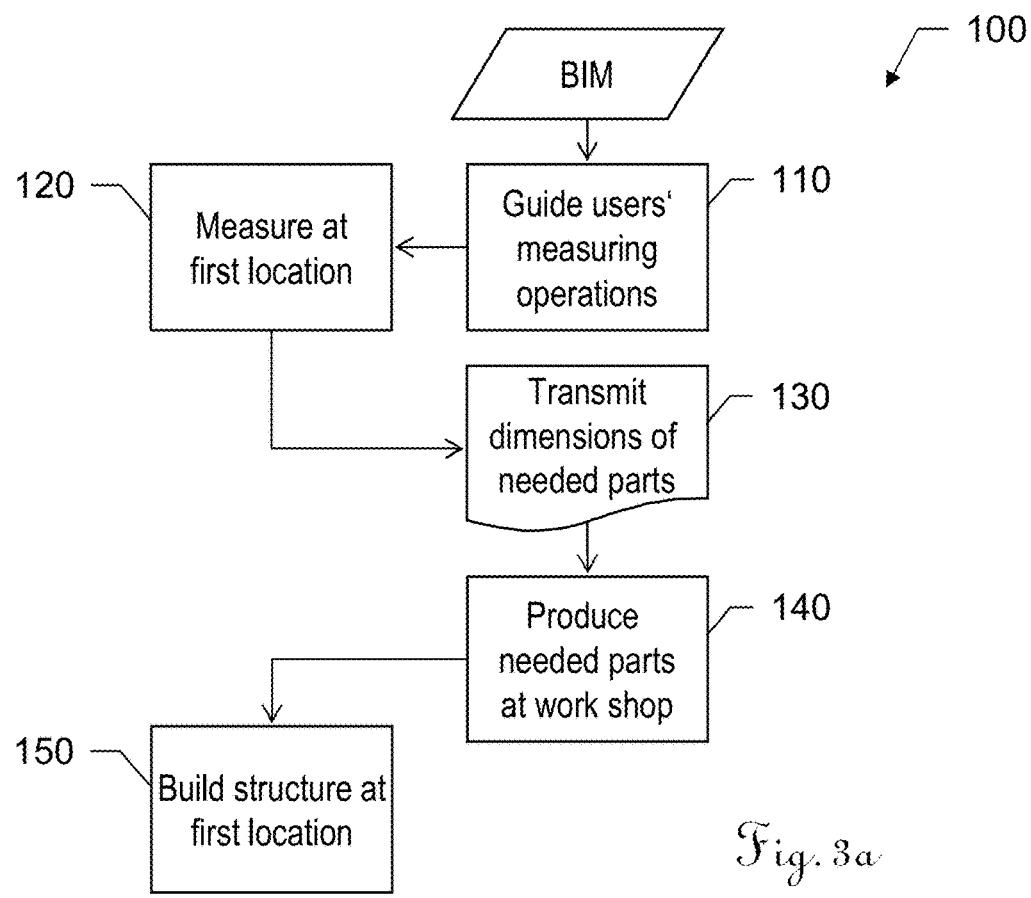
FIGS. 3a-b show flow-charts illustrating exemplary embodiments of a method for manufacturing needed parts at a construction site according to the invention.

FIG. 3*a* is a flow chart illustrating a first exemplary embodiment of a method 100 according to the invention for tailored manufacturing of parts using a building information model (BIM).

A BIM is provided. In the first step 110, a mobile device which has access to the BIM guides a user through a measurement operation based on BIM data. According to prompt messages of the device, the user performs a measurement 120 at the first location, determining dimensions of needed parts for a construction at the first location. The user e. g. can be a carpenter who has to build a drywall at a first location of the building. The determined dimensions are then transmitted 130 by the mobile device to a central work shop. With these dimensions, the needed parts are then produced 140 at the work shop, transported to the measured location and used to build the local structure 150. Optionally, the produced parts can be numbered after production in order to facilitate the building of the local structure.

Figure 3B:
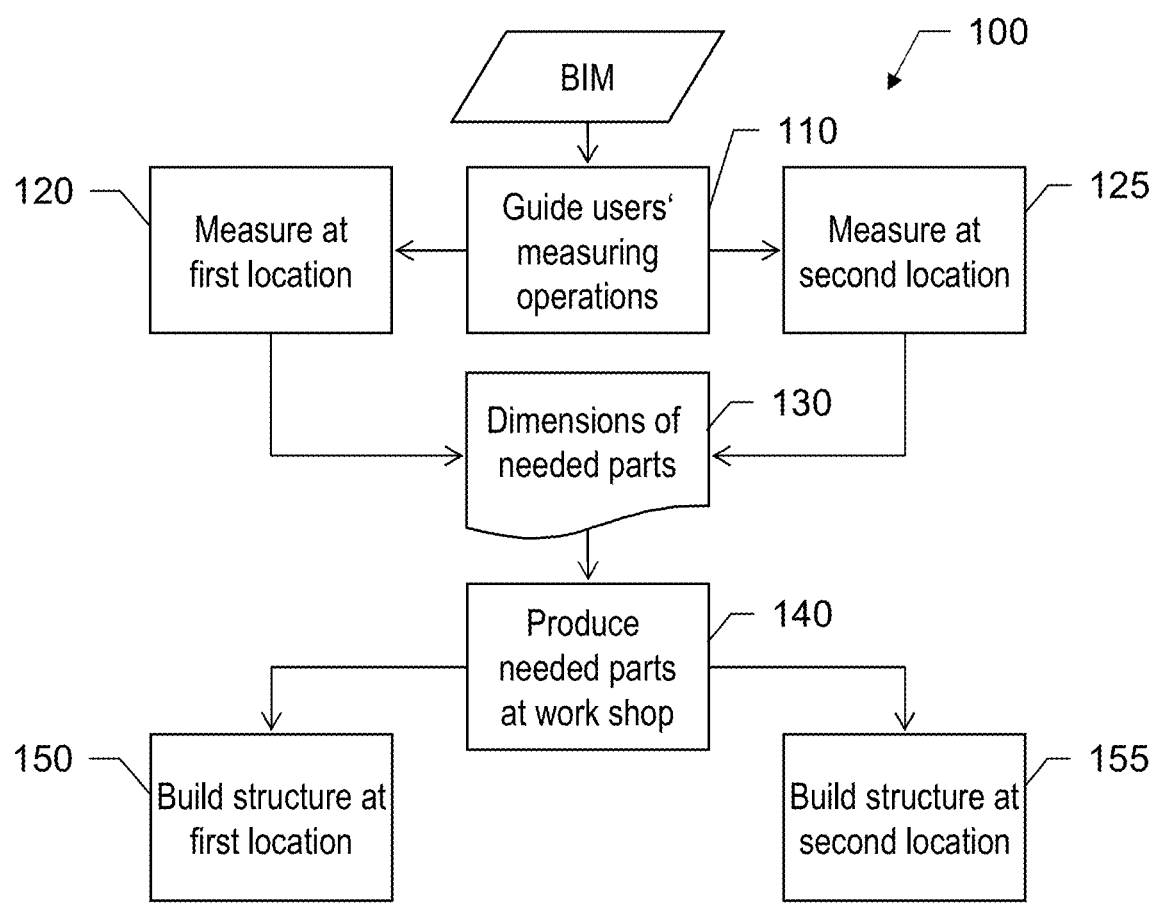

In FIG. 3*b*, a flow chart illustrating a second exemplary embodiment of a method 100 according to the invention is shown. In contrast to the first embodiment of FIG. 3*a*, measurements are performed at more than one location, and the determined dimensions from at least two locations are considered before producing the parts at the work shop. This further reduces waste material.

Figure 4:
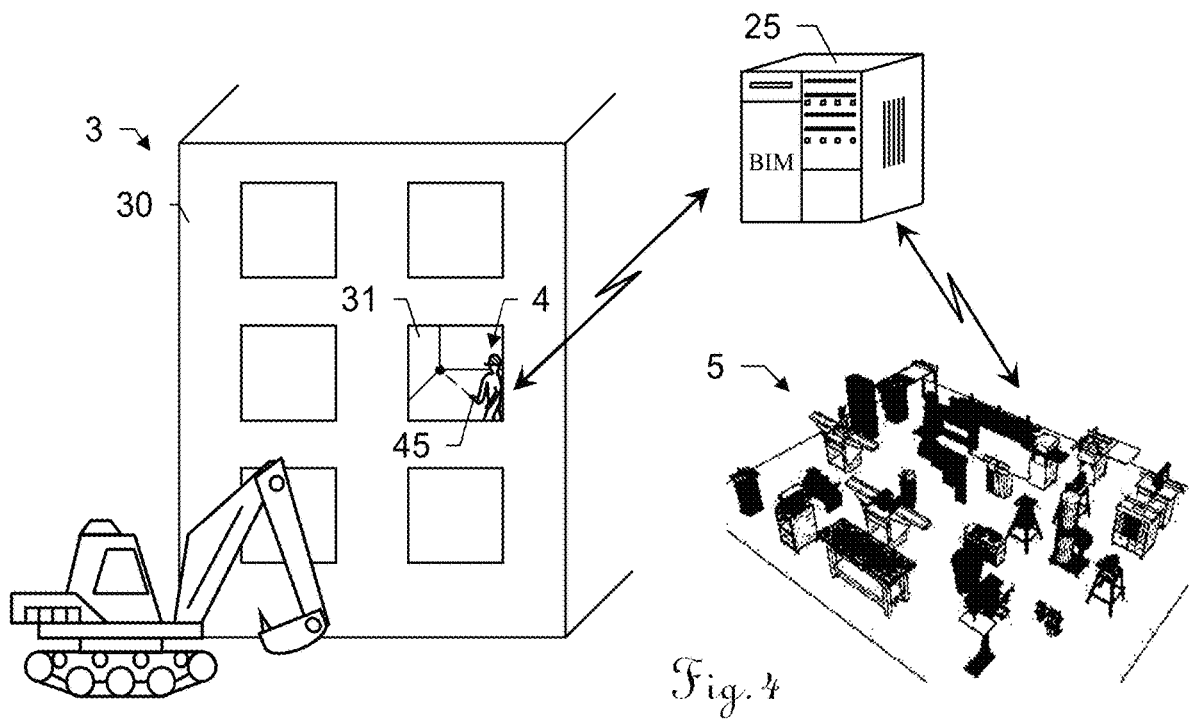
Figure 5:
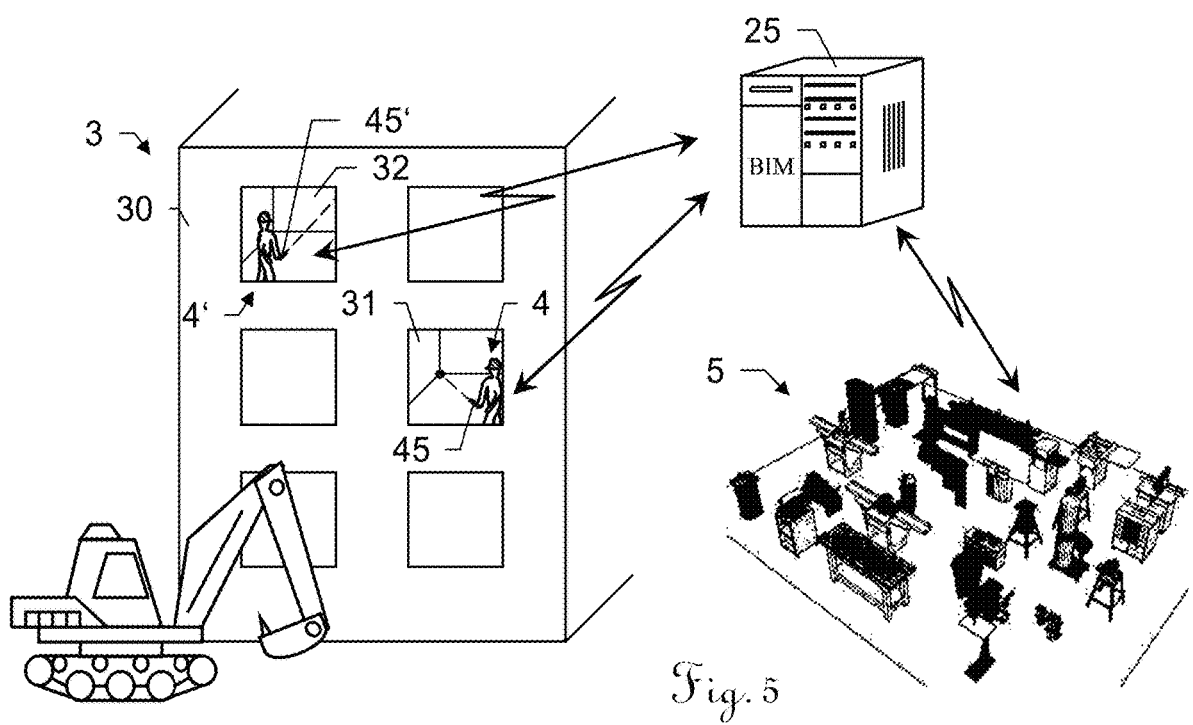
FIG. 5 illustrates the use of an exemplary embodiment of a construction management system according to the invention for performing the embodiment of the method of FIG. 3b.

FIGS. 4 and 5 illustrate the use of a construction management system according to the invention for performing the methods of FIGS. 3*a* and 3*b*.

The construction management system comprises a server computer 25 and a work shop 5 that are connected by means of an internet or intranet connection. The work shop 5 is located at a building site 3 of a building 30, i.e. either directly on the site itself, or next to the site, e. g. in the immediate vicinity, so that customised material produced at the work shop can be provided without delay due to transport.

In the example of FIG. 4, a user 4 operates a portable computing device 45 which is designed as a hand-held laser-based distance measuring device for measuring distances between points in a room 31 of the building 30. The computing device 45 has access to data provided by a building information model. The user is guided through the measuring operation by the computing device 45. From the measured distances, the computing device 45 calculates parts dimensions for the planned construction and transmits these dimensions wireless to the central computing unit 25. A work shop which is situated at the construction site 3 receives the parts dimensions and produces parts having these dimensions. These can then be used for the planned construction in room 31—either by the user 4 or someone else.

The computing device 45 and a measuring device can also be designed as separate devices. The results of the measurement can then either be input manually into the computing device 45, or the two devices are connected for exchanging data, e. g. connected by means of a cable, WiFi or Bluetooth.

In the example of FIG. 5, a first user 4 operates a first portable computing device 45, measuring distances between points in a first room 31 of the building 30, and a second user 4' operates a second portable computing device 45', measuring distances between points in a second room 32 of the same building 30. Alternatively, the measurements in the first and second rooms 31, 32 can be performed subsequently by the same user 4. Both computing devices 45, 45' are designed as hand-held laser-based distance measuring devices for measuring distances between points. The computing devices 45, 45' have access to data provided by a building information model. The users are guided through the measuring operation by the respective computing device 45, 45'. From the measured distances, the computing devices 45, 45' calculate parts dimensions for the planned construction and transmit these dimensions wireless to the central computing unit 25.

The computing devices 45, 45' optionally can be equipped with position determination means. Alternatively, the user 4, 4' has to enter the location before the computing device 45, 45' starts guiding him through the measuring. Information about the location or the project is then transmitted together with the measuring results or determined dimensions to the central computing unit 25.

The work shop 5 can be specialized to a certain kind of local structure or able to produce parts for various different kinds of structures. The work shop 5 preferably can be a mobile work shop that is easily transportable from building site to building site in order to produce parts for similar projects at different sites. The mobile work shop can be provided as a part of a vehicle, e. g. a van or truck, or a trailer. Alternatively, the mobile work shop can be provided in a container, particularly wherein the machines are fixedly positioned in the container. The mobile work shop container preferably has a standardized format to facilitate transport and storing. For instance, a mobile work shop container can be a 20-ft-long intermodal freight container.

The mobile work shop can be positioned in the centre of the construction site as well as outside, as long as it allows providing the customized parts for the local structures without delay.

Although the invention is illustrated above, partly with reference to some preferred embodiments, it must be understood that numerous modifications and combinations of different features of the embodiments can be made. All of these modifications lie within the scope of the appended claims.

What is claimed is:

1. A construction management system for the construction of a building at a construction site, the building comprising at least a first room and a second room, the construction site comprising at least a first local structure at a first location and a second local structure at a second location, wherein the first location is in the first room and the second location is in the second room, the construction management system comprising:
   a central computing unit providing a building information model that provides data about the construction site and the building;
   a mobile work shop, the mobile work shop being provided at the construction site, comprising a fixed set of machines and being adapted for producing similar parts for similar local structures at a multitude of different constructions sites; and
   at least a first and a second hand held laser-based distance measuring device, each of the hand held laser-based distance measuring devices comprising an electronic distance meter and being connectable to the central computing unit by means of a wireless data connection, wherein
   the first hand held laser-based distance measuring device is configured to perform a first measuring operation at the first location, the first measuring operation comprising:
      providing data related to the first location comprised by the building information model to a first user,
      using data provided by the building information model to guide the first user through the first measuring operation,
      using the electronic distance meter to measure distances at the first location,
      calculating, based on the distances measured at the first location, first parts dimensions for the first local structure, and
      transmitting, during or directly after the first measuring operation, the first part dimensions via the wireless data connection to the work shop; and
   the second hand held laser-based distance measuring device is configured to perform a second measuring operation at the second location, the second measuring operation comprising:
      providing data related to the second location comprised by the building information model to a second user,
      using data provided by the building information model to guide the second user through the second measuring operation,
      using the electronic distance meter to measure distances at the second location,
      calculating, based on the distances measured at the second location, second parts dimensions for the second local structure, and
      transmitting, during or directly after the second measuring operation, the second part dimensions via the wireless data connection to the work shop;
   wherein the mobile work shop is configured:
      to receive the first part dimensions and the second part dimensions;
      to produce, autonomously by at least one machine of the mobile work shop and taking into account the first part dimensions and the second part dimensions, parts needed for building the first local structure; and
      to produce, autonomously by at least one machine of the mobile work shop, parts needed for building the first local structure and parts needed for building the second local structure, wherein the mobile work shop is configured to take into account the first part dimensions and the second part dimensions for producing the parts needed for building the first local structure.

2. The system according to claim 1, wherein the mobile work shop is configured to take into account the first part dimensions and the second part dimensions for producing the parts needed for building the second local structure.

3. The system according to claim 1, wherein the mobile work shop is configured to give numbers to the produced parts for facilitating:
   transporting the produced parts to the first location and the second location, and
   building the first local structure and the second local structure using the produced parts.

4. The system according to claim 1, wherein the building information model comprises at least a three-dimensional model of the construction site or of the building.

5. The system according to claim 1, wherein the building information model comprises at least a construction plan comprising a target state of the construction of the building and information about a current construction state of the building.

6. The system according to claim 5, wherein
   the first and a second hand held laser-based distance measuring devices are configured to transmit the determined dimensions to the central computing unit, and
   the central computing unit is configured to use the determined dimensions to update the current construction state of the building.

7. The system according to claim 1, wherein the central computing unit comprises a server computer or a cluster of server computers working as a cloud system, wherein the first hand held laser-based distance measuring device and the second hand held laser-based distance measuring device are configured to transmit the calculated dimensions to the central computing unit by means of an internet or intranet connection.

8. The system according to claim 7, wherein the central computing unit is configured to transmit the determined dimensions to the work shop.

9. The system according to claim 8, wherein at least one machine of the workshop is connected to the central computing unit by means of an internet or intranet connection.

10. The system according to claim 1, wherein the first local structure and the second local structure comprise a drywall and the produced parts comprise plaster boards and studs.

11. The system according to claim 1, wherein
   the first and second hand held laser-based distance measuring devices each have position determination means configured to automatically determine a position of the respective device within the building, and guiding a user through a measuring operation is based on the automatically determined position.

12. The system according to claim 1, wherein the mobile work shop is provided in a container which has a standardized format, wherein the machines of the mobile workshop are fixedly positioned in the container.

13. The system according to claim 12, wherein the container is a 20-ft-long intermodal freight container.

14. A method for producing parts for a plurality of local structures at a construction site of a building, the building comprising at least a first room and a second room, the plurality of local structures at the construction site comprising at least a first local structure at a first location and a second local structure at a second location, wherein the first location is in the first room and the second location is in the second room, the method comprising providing a construction management system comprising:
a central computing unit providing a building information model that provides data about the construction site and the building;
a mobile work shop, the mobile work shop being provided at the construction site, comprising a fixed set of machines and being adapted for producing similar parts for similar local structures at a multitude of different constructions sites; and
at least a first and a second hand held laser-based distance measuring devices, each of the hand held laser-based distance measuring devices comprising an electronic distance meter and being configured:
to measure distances using the electronic distance meter,
to calculate, based on measured distances, parts dimensions of parts needed for the construction of local structures,
to be connectable to the central computing unit by means of a wireless data connection,
to provide data comprised by the building information model to a user,
to transmit calculated parts dimensions to the work shop in real time, and
to use data provided by the building information model to guide a user through a measuring operation;
the method further comprising:
guiding, by the first hand held laser-based distance measuring device, a first user through a first measuring operation at the first location, the first measuring operation comprising using the electronic distance meter of the first hand held laser-based distance measuring device to measure distances at the first location;
calculating, by the first hand held laser-based distance measuring device and based on the distances measured at the first location, first parts dimensions for the first local structure;
transmitting, during or directly after the first measuring operation, the first part dimensions via the wireless data connection to the mobile work shop;
guiding, by the second hand held laser-based distance measuring device, a second user through a second measuring operation at the second location, the second measuring operation comprising using the electronic distance meter of the second hand held laser-based distance measuring device to measure distances at the second location;
calculating, by the second hand held laser-based distance measuring device and based on the distances measured at the second location, second parts dimensions for the second local structure;
transmitting, during or directly after the second measuring operation, the second part dimensions via the wireless data connection to the mobile work shop;
receiving at the mobile work shop, which is situated at the construction site, the first part dimensions and the second part dimensions; and
producing, autonomously by at least one machine of the mobile work shop, parts needed for building the first local structure and parts needed for building the second local structure, wherein producing the parts needed for building the first local structure comprises taking into account the first part dimensions and the second part dimensions.

15. The method according to claim 14, wherein producing the parts needed for building the first local structure comprises taking into account the first part dimensions and the second part dimensions.

16. The method according to claim 14, wherein producing the parts comprises giving numbers to the produced parts for facilitating the building of the local structures, the method further comprising
transporting the produced parts to the first location and the second location considering the given numbers; and
building the first local structure and the second local structure using the produced parts considering the given numbers.

17. The method according to claim 14, wherein the building information model comprises at least a three-dimensional model of the construction site or of the building.

18. The method according to claim 14, wherein the building information model comprises at least a construction plan comprising a target state of the construction of the building and information about a current construction state of the building.

19. The method according to claim 18, wherein the determined dimensions are transmitted to the central computing unit and used to update the current construction state of the building.

20. The method according to claim 14, wherein the central computing unit comprises a server computer or a cluster of server computers working as a cloud system, wherein the first hand held laser-based distance measuring device and the second hand held laser-based distance measuring device transmit the calculated dimensions to the central computing unit by means of an internet or intranet connection.

21. The method according to claim 20, wherein the determined dimensions are transmitted to the work shop via the central computing unit.

22. The method according to claim 21, wherein the needed parts are produced by at least one machine of the workshop that is connected to the central computing unit by means of an internet or intranet connection.

23. The method according to claim 14, wherein the first local structure and the second local structure comprise a drywall and the produced parts comprise plaster boards and studs.

24. The method according to claim 14, wherein
the first and second hand held laser-based distance measuring devices each have position determination means configured to automatically determine a position of the respective device within the building, and
guiding a user through a measuring operation is based on the automatically determined position.

25. The method according to claim 14, wherein the mobile work shop is provided in a container which has a standardized format, wherein the machines of the mobile workshop are fixedly positioned in the container.

26. The method according to claim 25, wherein the container is a 20-ft-long intermodal freight container.

* * * * *